(12) United States Patent
Cui et al.

(10) Patent No.: US 7,228,516 B2
(45) Date of Patent: Jun. 5, 2007

(54) NEGATIVE BIAS TEMPERATURE INSTABILITY MODELING

(75) Inventors: Qian Cui, San Jose, CA (US); Sandeep Bhutani, Pleasanton, CA (US)

(73) Assignee: LSI Corporation, Milpitas, CA (US)

( * ) Notice: Subject to any disclaimer, the term of this patent is extended or adjusted under 35 U.S.C. 154(b) by 134 days.

(21) Appl. No.: 11/061,581

(22) Filed: Feb. 18, 2005

(65) Prior Publication Data
US 2006/0190859 A1    Aug. 24, 2006

(51) Int. Cl.
*G06F 17/50* (2006.01)
(52) U.S. Cl. ............................................. 716/6; 716/18
(58) Field of Classification Search .................... 716/1, 716/2, 6, 18
See application file for complete search history.

(56) References Cited

U.S. PATENT DOCUMENTS

2003/0042926 A1*   3/2003   Rost et al. .................. 324/765

\* cited by examiner

*Primary Examiner*—Thuan Do
(74) *Attorney, Agent, or Firm*—Luedeka, Neely & Graham

(57) ABSTRACT

A method for accounting for negative bias temperature instability in a rise delay of a circuit design, the method comprising the steps of create a cell and net model library with original rise numbers, construct the circuit design from the cell and net models, for each cell and net in the circuit design, calculate an original rise delay, apply a negative bias temperature instability model to determine a parameter shift, determine a new rise number from the parameter shift, and calculate a new rise delay by original rise delay* (original rise number)/(new rise number).

14 Claims, 1 Drawing Sheet

100

NEGATIVE BIAS TEMPERATURE INSTABILITY MODELING

FIELD

This invention relates to the field of integrated circuit fabrication. More particularly, this invention relates to designing integrated circuits, most especially PMOS devices in mixed signal, analog, or I/O circuits.

BACKGROUND

When a PMOS device is subjected to different operational conditions, a shift in certain operating parameters, such as threshold voltage, can often be observed. For example, when a PMOS device is operated at a given temperature and gate bias for a given time, there tends to be a shift, or degradation, in the threshold voltage of the device. This effect is generally referred to as negative bias temperature instability. This phenomenon tends to have a large effect on analog circuit elements, such as source coupled MOSFET pairs. However, the effect tends to be transient, and the threshold voltage returns to about its original value when the charged states de-trap after the gate stress is removed.

When designing an integrated circuit, issues such as negative bias temperature instability should be accounted for, or the integrated circuit may not function properly. Certain integrated circuits, such as mixed signal cells, analog circuits, and I/O circuits may not function at all. In addition, the effects of negative bias temperature instability tend to be different for alternating current devices than they are for direct current devices.

Various experiments have been performed to measure negative bias temperature instability effects on various transistor parameters, such as voltage threshold and saturation current, at different physical conditions, such as alternating current, direct current, gate voltage, temperature, frequency, duty cycle, and stress time. Different models have been developed based upon the experimental data so produced. These models all tend to correlate a given parameter shift as a function of duty cycle, frequency, time, and temperature.

A common practice in the industry is to build the model for such parameter shifts into a larger circuit modeling routine, such as a PMOS HSPICE model library, and characterize the cell library with the negative bias temperature instability model. One drawback of this approach is that the worst case parameter is built into the model library in order to cover all possible operating conditions. Because the model is frequency and temperature dependent, this approach tends to over margin the design in most embodiments. Another drawback of this approach is that the negative bias temperature instability worst case corner—high voltage and high temperature—does not match the worst case delay corner—low voltage and high temperature. Thus, this corner-centric model library may not represent the true worst case negative bias temperature instability effect. Multiple corner libraries tend to be prohibited due to the large HSPICE simulation time required.

What is needed, therefore, is a system for including negative bias temperature instability models in integrated circuit models that overcomes problems such as those described above, at least in part.

SUMMARY

The above and other needs are met by a method for accounting for negative bias temperature instability in a rise delay of a circuit design, the method comprising the steps of create a cell and net model library with original rise numbers, construct the circuit design from the cell and net models, for each cell and net in the circuit design, calculate an original rise delay, apply a negative bias temperature instability model to determine a parameter shift, determine a new rise number from the parameter shift, using $$Tr = \frac{2C}{(\text{Beta})(V_{dd})(1-p)\left[p - \frac{0.10}{(1-p)} + \frac{\ln(19-20p)}{2}\right]}$$

where Tr is the new rise number of the cell or net, $p=|Vtp|/Vdd$, and C is a load, and calculate a new rise delay by original rise delay*(original rise number)/(new rise number). In various embodiments the cell and net models and the original rise number are developed in SPICE.

According to another aspect of the invention there is described a method for accounting for negative bias temperature instability in a rise delay of a circuit design. A standard cell and net model library is created with original rise delays, and an NBTI cell and net model library is created with voltage threshold and mobility data. A standard design path is constructed using the standard model library, and an NBTI design path is constructed that is a duplicate of the standard design path using the NBTI model library. Rise numbers for the standard design path and the NBTI design path are computed. A new rise delay is computed from the NBTI design path rise number, the original rise delays, and the standard design path rise number. In various embodiments the voltage threshold data and the mobility data is acquired either experimentally or by simulation.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Because negative bias temperature instability is frequency dependent, it is preferably modeled according to the current invention in a delay calculator at a later time when the frequency of the cell or net is known, rather than earlier in the HSPICE model when the frequency of a given cell or net is not known. In the delay calculation stage, the integrated circuit design is provided and the clock frequency of each cell in the design is known. Using any one or more of the models based on the generalized equation for negative bias temperature instability, a parameter shift at a particular frequency can be calculated for a given cell in the delay calculator, which is more efficient than building multiple libraries into the HSPICE model. Once the parameter shift is calculated for the cell, the following equation or its equivalent is preferably used to scale the calculated rise delay number:

$$Tr = \frac{2C}{(\text{Beta})(V_{dd})(1-p)\left[p - \frac{0.10}{(1-p)} + \frac{\ln(19-20p)}{2}\right]} \quad (1)$$

where Tr is the rise delay of the given cell, $p=|V_{tp}|/V_{dd}$, and C is the load.

This equation can be used to calculate the rise delay from the $V_{tp}$ shift, which is calculated using one of the models based on the generalized negative bias temperature instability equation given above. A ratio of the original or base delay from the delay calculator and the rise delay from equation (1) above are used to determine the new delay, which accounts for the negative bias temperature instability, given as:

New Delay=Original Delay*(Tr orig)/(Tr new) (2)

Without negative bias temperature instability information, the delay calculator calculates net and cell delays based on cell libraries and net parasitic information, without considering the negative bias temperature instability. Those calculated delays are then used for static timing analyses. This new method incorporates negative bias temperature instability calculations into the delay calculator so that the calculated net and cell delay numbers include the negative bias temperature instability effect.

Figure 1:
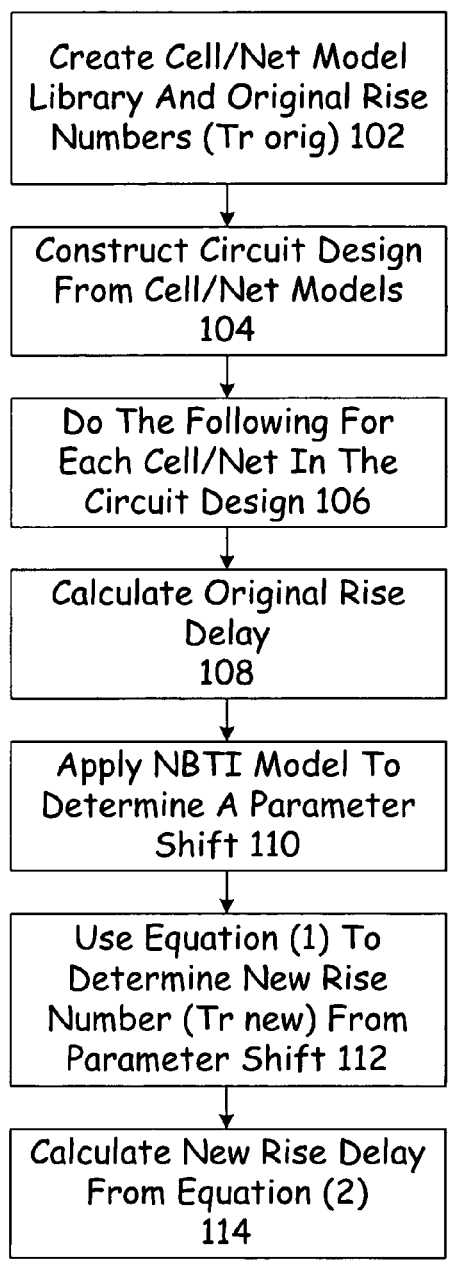
FIG. 1 is a flow chart of a first method of accounting for negative bias temperature instability in rise delay.

One embodiment 100 of the flow for timing closure as depicted in FIG. 1 is like this: First, some transistor model libraries are created, such as in SPICE, based on semiconductor process parameters, as given in block 102. A characterization tool and the transistor model library are used to produce standard cell libraries, where the standard cell libraries contain the original or base cell delay numbers (Tr orig) in a table form. After a circuit design has been constructed, as given in block 104, a delay calculator is used to calculate the new cell and net delays based on the standard cell libraries and the wire resistance/capacitance parasitic information. The frequencies for the cells and nets are known at this stage, and so the negative bias temperature instability effect can be more accurately and individually calculated for the cells and nets.

The procedure is performed on each cell or net in the design, as given in block 106. The original rise delay is calculated without reference to the negative bias temperature instability model, as given in block 108. Then the negative bias temperature instability model is applied to determine a shift in a given parameter, as given in block 110. Equation (1) is then used to determine the new rise number (Tr new) from the parameter shift, as given in block 112. Finally, the new rise delay is calculated from equation (2), as given in block 114. Other parameters are then scaled based on a ratio of the original and the new delay values.

Figure 2:
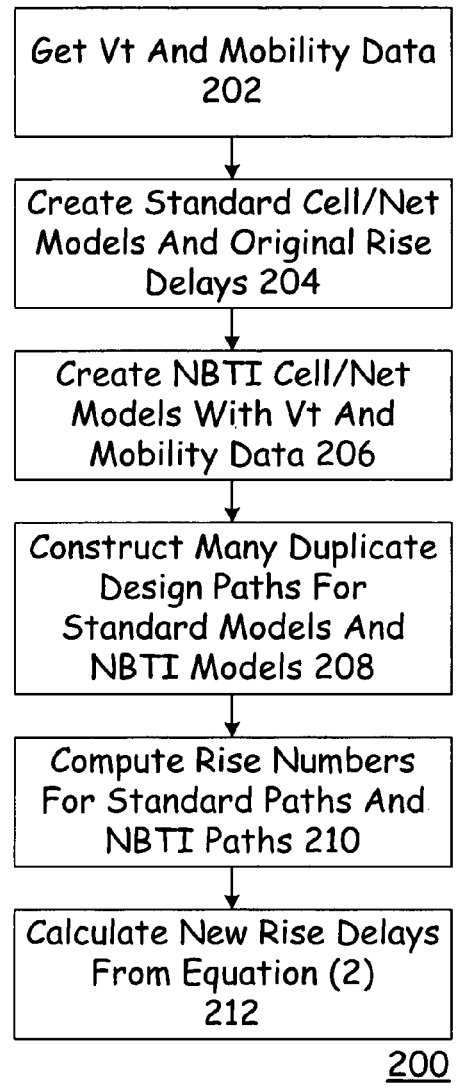
FIG. 2 is a flow chart of a second method of accounting for negative bias temperature instability in rise delay.

According to another embodiment 200 of the invention, as depicted in FIG. 2, the negative bias temperature instability effect at any of the corners of the voltage versus temperature plot can be determined. The first step is to get parameter shift information for the voltage threshold and carrier mobility of the integrated circuit, as given in block 202. The voltage threshold information may be experimentally measured, and the mobility data may either be experimentally derived or come from an integrated circuit simulator such as HSPICE, by tuning the mobility parameter in the model library and matching the experimental current saturation shift data.

Two model libraries are then preferably constructed for the integrated circuit simulator, such as HSPICE. One library is the nominal model library, as given in block 204, and the other is the negative bias temperature instability model library, with the voltage threshold and the mobility shift numbers for the PMOS transistor added in, as given in block 206.

Next, large amounts of real design paths are extracted, and a SPICE deck generation tool is used to generate the SPICE deck for these paths, as given in block 208. Two sets of simulations are performed, one using the nominal SPICE model libraries, and the other using the negative bias temperature instability model libraries. After computing the HSPICE path delay numbers for both the nominal and the negative bias temperature instability decks, as given in block 210, the two delay numbers are compared using equation (2), and the design margin at the given PVT corner for a given frequency can be determined from the comparison, as given in block 212.

This second embodiment derives a negative bias temperature instability margin number for a design based on the negative bias temperature instability SPICE model library. The difference between this method and the traditional industry method is that this method does not use standard cell libraries and delay calculators, it just does two sets of simulations on multiple real design paths and gets some timing numbers. Later these numbers are added to the static timing analysis tool when the timing closure check for the design is performed. This method is quick and can perform at multiple negative bias temperature instability corners, and get multiple timing margins at each corner.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

We claim:

1. A method for accounting for negative bias temperature instability in a rise delay of a circuit design, the method comprising the steps of:
    for each cell and net in the circuit design,
        calculate an original rise delay,
        apply a negative bias temperature instability model to determine a parameter shift,
        determine a new rise number from the parameter shift, and
        calculate a new rise delay from the new rise number, the original rise delay, and an original rise number.

2. The method of claim 1, wherein the circuit design is constructed from cell and net models developed in SPICE.

3. The method of claim 1, wherein the original rise number is developed in SPICE.

4. The method of claim 1, wherein the new rise number is determined using:

$$Tr = \frac{2C}{(\text{Beta})(V_{dd})(1-p)\left[p - \frac{0.10}{(1-p)} + \frac{\ln(19-20p)}{2}\right]}$$

where Tr is the new rise number of the cell or net, $p=|V_{tp}|/V_{dd}$, and C is a load.

5. The method of claim 1, wherein the new rise delay is calculated by original rise delay*(original rise number)/(new rise number).

6. A method for accounting for negative bias temperature instability in a rise delay of a circuit design, the method comprising the steps of:
create a cell and net model library with original rise numbers,
construct the circuit design from the cell and net models,
for each cell and net in the circuit design,
  calculate an original rise delay,
  apply a negative bias temperature instability model to determine a parameter shift,
  determine a new rise number from the parameter shift, using $$Tr = \frac{2C}{(\text{Beta})(V_{dd})(1-p)\left[p - \frac{0.10}{(1-p)} + \frac{\ln(19-20p)}{2}\right]}$$

where Tr is the new rise number of the cell or net, $p=|V_{tp}|/V_{dd}$, and C is a load, and
calculate a new rise delay by original rise delay*(original rise number)/(new rise number).

7. The method of claim 6, wherein the cell and net models are developed in SPICE.

8. The method of claim 6, wherein the original rise number is developed in SPICE.

9. A method for accounting for negative bias temperature instability (NBTI) in a rise delay of a circuit design, the method comprising the steps of:
create a standard cell and net model library with original rise delays,
create an NBTI cell and net model library with voltage threshold and mobility data,
construct a standard design path using the standard model library,
construct an NBTI design path that is a duplicate of the standard design path using the NBTI model library,
compute rise numbers for the standard design path and the NBTI design path,
calculate a new rise delay from the NBTI design path rise number, the original rise delays, and the standard design path rise number.

10. The method of claim 9, wherein the voltage threshold data is acquired experimentally.

11. The method of claim 9, wherein the voltage threshold data is acquired by simulation.

12. The method of claim 9, wherein the mobility data is acquired experimentally.

13. The method of claim 9, wherein the mobility data is acquired by simulation.

14. The method of claim 9, wherein a plurality of standard design paths and NBTI design paths are constructed and new rise delays calculated therefor.

* * * * *